United States Patent [19]

Morris et al.

[11] 4,097,890
[45] Jun. 27, 1978

[54] LOW PARASITIC CAPACITANCE AND RESISTANCE BEAMLEAD SEMICONDUCTOR COMPONENT AND METHOD OF MANUFACTURE

[75] Inventors: Raymond A. Morris, Sunnyvale; Thomas J. Viola, Jr., Mountain View, both of Calif.

[73] Assignee: Hewlett-Packard Company, Palo Alto, Calif.

[21] Appl. No.: 780,373

[22] Filed: Mar. 23, 1977

Related U.S. Application Data

[62] Division of Ser. No. 699,130, Jun. 23, 1976, abandoned.

[51] Int. Cl.² ............................................. H01L 29/06
[52] U.S. Cl. .................................... 357/55; 357/49; 357/52; 357/56; 357/68; 357/69; 357/71
[58] Field of Search ................... 357/49, 52, 55, 56, 357/68, 69, 71

[56] References Cited

U.S. PATENT DOCUMENTS

| | | | |
|---|---|---|---|
| 3,648,131 | 3/1972 | Stuby | 357/55 |
| 3,884,733 | 5/1975 | Bean | 357/55 |
| 3,969,745 | 7/1976 | Blocker | 357/55 |
| 3,979,765 | 9/1976 | Brand | 357/55 |

*Primary Examiner*—Edward J. Wojciechowicz
*Attorney, Agent, or Firm*—Allston L. Jones

[57] ABSTRACT

A beamlead semiconductor component and a method for manufacturing the semiconductor device with low parasitic capacitance and electrical resistance is provided. The beamlead component includes a thick layer of glass forming one end of the component directly beneath one of the beamleads and extending up to the edge of the active device on the beamlead surface of the component. On the opposite side of the active device from the glass layer is a metalized cavity that provides the electrical contact for a second beamlead with the semiconductor substrate. From the other surface, the non-beamlead surface, of the component another metalized cavity adjacent to the active region of the component and the metalized cavity on the beamlead surface has been etched. The cavity in the other surface of the component exposes a portion of the deepest surface of the metalization in the cavity on the beamlead surface to make electrical contact between the two metalizations. These interconnected cavities thus provide an electrical via between the two surfaces of the component.

The use of the thick layer of glass beneath the one beamlead provides a considerable reduction in the parasitic capacitance between this beamlead and various layers of the substrate to which it is not connected. The metalized cavity in the other surface of the component substrate and the via reduces the resistance of the device by thinning the substrate beneath the active region and limiting the length of longest current path through the semiconductor material to a single thickness of that material.

5 Claims, 8 Drawing Figures

LOW PARASITIC CAPACITANCE AND RESISTANCE BEAMLEAD SEMICONDUCTOR COMPONENT AND METHOD OF MANUFACTURE

CROSS REFERENCE TO RELATED APPLICATION

This is a division of application Ser. No. 699,130, filed June 23, 1976 now abandoned.

BACKGROUND OF THE INVENTION

Beamlead devices are ideally suited for use in stripline and microstrip circuits at microwave frequencies. Small physical size and uniform dimensions are the predominant characteristics that make the use of beamlead devices possible at microwave frequencies. There are two characteristics of which at least one is a limiting factor to the use of most beamlead devices at higher microwave frequencies. These characteristics are parasitic capacitance and the electrical resistance of the device. Parasitic capacitance between the beamleads and the various conductivity type layers to which they are not connected limits the upper useful frequency of most beamlead devices. For devices such as PIN diodes, the electrical resistance of the current path between the beamleads can be critical to the operation of the device.

In a typical prior art beamlead device a layer of glass is deposited on the surface of the substrate up to the edge of the mesa or the active region. A beamlead is then formed by plating a selected metal across the glass to make contact with a desired layer of the active device. These glass layers are typically less than $25\mu$ thick and thus provide only a moderate reduction in parasitic capacitance.

The prior art low electrical resistance semiconductor devices typically utilize a low resistivity substrate material that has been thinned to a uniform thickness. This uniform thinning increases the fragility of the substrate so the electrical resistance of the device is generally compromised to facilitate processing and to increase the yield of the substrate. Additionally, each of the beamleads of a typical device contact a selected conductivity type layer on only the beamlead surface, thus creating a lateral current path of relatively great length through the substrate. This long current between the beamleads increases the electrical resistance of the device.

SUMMARY OF THE INVENTION

The present invention provides a low parasitic capacitance and low electrical resistance beamlead semiconductor component and a method for its manufacture. Initially, a semiconductor substrate with a first and second surface, and a selected crystalline orientation and conductivity type is selected. If a mesa structure is desired for the finished component, the first surface of the substrate is etched to form that mesa followed by the fabrication of the active regions thereon. Otherwise, the semiconductor is fabricated on the first surface as a planar structure.

Juxtaposed to the location of the base of the mesa or a selected surface layer of the semiconductor component to which a first beamlead is to make contact in the mesa or planar structures, respectively, a deep first cavity of limited lateral extent is etched into the first surface of the substrate. On the opposite side of, and adjacent to, the mesa or the planar device structure, a smaller, shallower second cavity of limited lateral extent is etched into the first surface of the substrate. A layer of glass with selected characteristics is then deposited in the first cavity with its top surface extending across the cavity to the nearest edge of the active device or the top surface of the mesa. The first and a second beamlead are then fabricated on the first surface of the substrate. The first beamlead extends from the selected surface layer either on the top of the mesa or in the planar field, across the glass layer and over the substrate field beyond for a predetermined distance. The second beamlead fills the second cavity with metal and extends beyond this cavity over the substrate field beyond and away from the active region for a predetermined distance.

A third cavity of limited lateral extent is etched into the second surface of the substrate adjacent to the active device and the second cavity on the first surface of the substrate. The etching of the third cavity is continued until the surface of the deepest extent of the metal within the second cavity is exposed to the second surface of the substrate. The surface of the third cavity is then metalized forming a via through the substrate by means of the metalization within the second and third cavities. After the completed semiconductor component is separated from the remainder of the substrate, the thick glass layer forms one end of the component with the bottom, both ends and the side away from the active region exposed. It is this exposed glass layer that abuts the active region or the mesa that isolates the first beamland from the various conductive layers of the component to which it is not connected. The low resistance of the device is achieved by the combination of the low resistivity of the substrate material and the shortened current path through the substrate provided by the third cavity and the metalized via between the metalized surface of the third cavity and the second beamlead.

DESCRIPTION OF THE PREFERRED EMBODIMENT

Figure 7A:
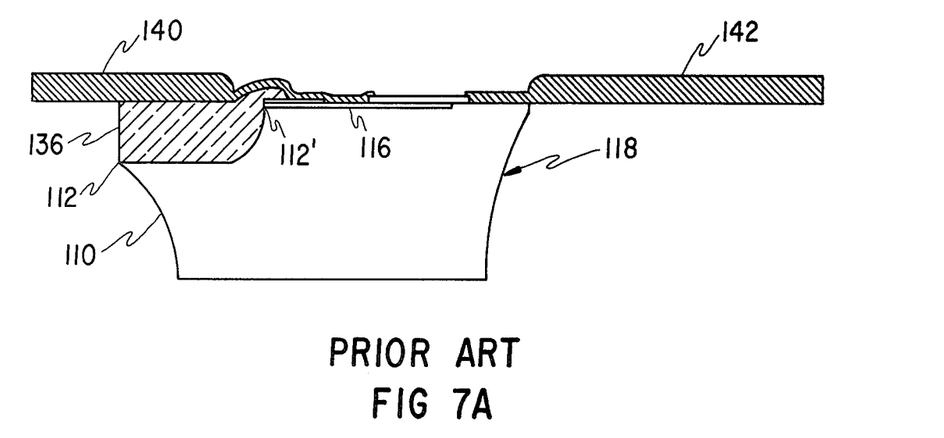
FIGS. 7a and 7b are cross-sectional views of prior art mesa and planar beamlead structures, respectively.
Figure 7B:
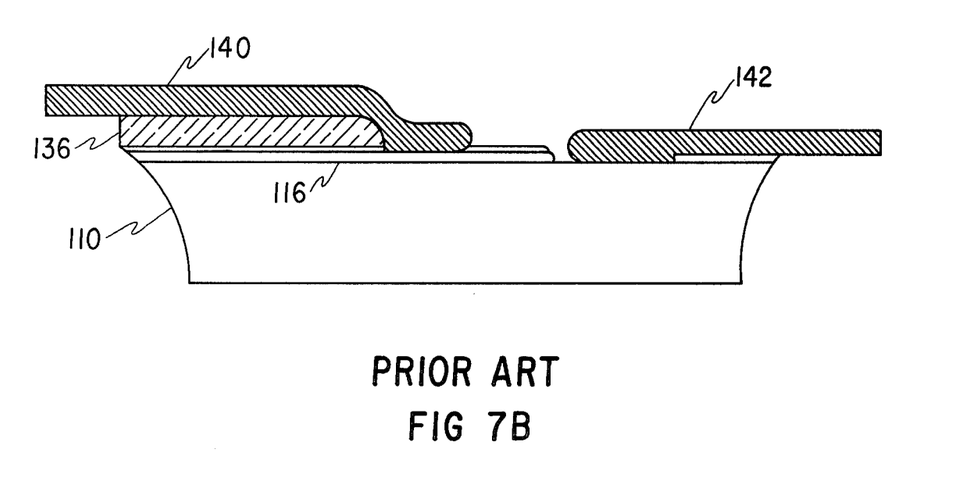

FIGS. 7a and 7b show a typical mesa and planar structure implementations, respectively, of a beamlead Schottky diode of the prior art. FIG. 7a shows a semiconductor substrate 110 with a first surface 112 that is the result of the isotropic etching of original first surface 112 of substrate 110 to form at least one mesa 118. On top of mesa 118 an epitaxial layer 116 has been grown. Immediately below cathode beamlead 142, epitaxial layer 116 has been diffused with an appropriate element to alter its conductivity to that of substrate 110. To reduce the parasitic capacitance between anode beamlead 140 and substrate 110, a glass layer 136 has been deposited therebetween. The thickness of glass layer 136 is typically $25\mu$ or less. FIG. 7b shows a planar construction of a similar device where the glass layer 136 has been deposited directly on the surface of substrate 110 and anode beamlead 140 plated thereover. In this configuration glass layer 136 is typically $12\mu$ thick or less.

The immediately following description refers to the structure of a low electrical resistance and low parasitic capacitance semiconductor component. The steps to be described of fabricating the semiconductor device and two cavities adjacent thereto on one surface of the substrate and the thinning of, and the etching of a third cavity into, the other surface of the substrate can be performed in any order. It is also possible to intermix the many sub-steps of the above-mentioned steps to achieve the same result. However, to maximize the component yield from the substrate, it is desirable to maintain the structural strength of the substrate through as much of the process as possible. Therefore, the preferred order is to complete the fabrication steps on the device side of the substrate before the other side is thinned and the third cavity etched therein.

The discussion that follows illustrates a particular implementation of a low resistance PIN diode by the preferred technique.

Figure 1:
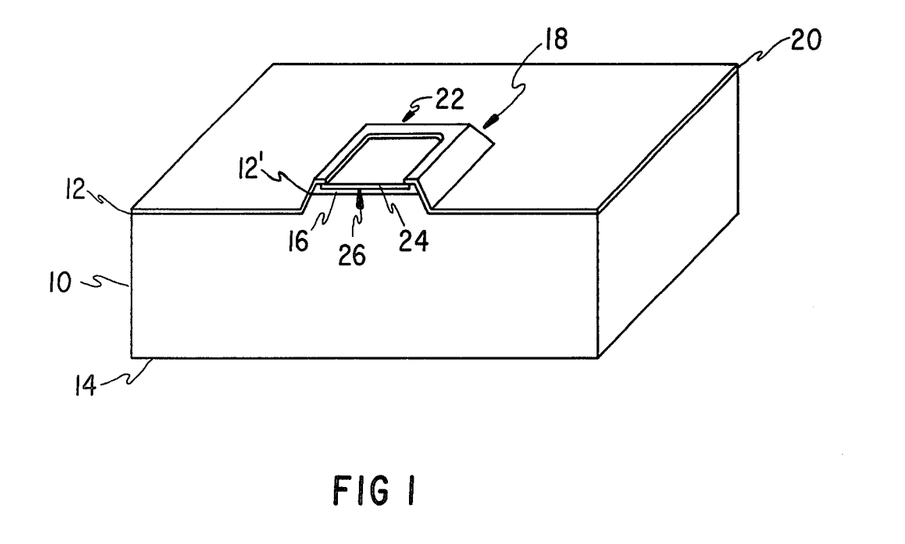
FIG. 1 is a cross-sectional projection along the longitudinal centerline of a semiconductor substrate with a semiconductor device on a mesa structure on one surface of the substrate wherein the half of the substrate not shown is a mirror image of that which is shown.

FIG. 1 shows a semiconductor substrate 10 with a first surface 12 and a second surface 14. Substrate 10 will typically be selected to have a (100) crystalline orientation and be of a low resistivity $n^+$ conductivity type Si. First surface 12 is prepared by epitaxially growing an $n^-$ layer 16 on the entire original first surface 12" of substrate 10, followed by masking and etching operations to form at least one mesa 18. This masking and etching step can be performed by known photolithographic and etching techniques and the field surrounding each mesa 18 defined thereby establishes first surface 12. The height of mesa 18 is typically $5\mu$ and equals or slightly exceeds the thickness of epitaxial layer 16. A first protective layer 20 (typically $SiO_2$) is shown on first surface 12 with a shallow $p^+$ conductivity layer 24 diffused into epitaxial layer 16 through a window 22 to form diode 26 on mesa 18.

Figure 2:
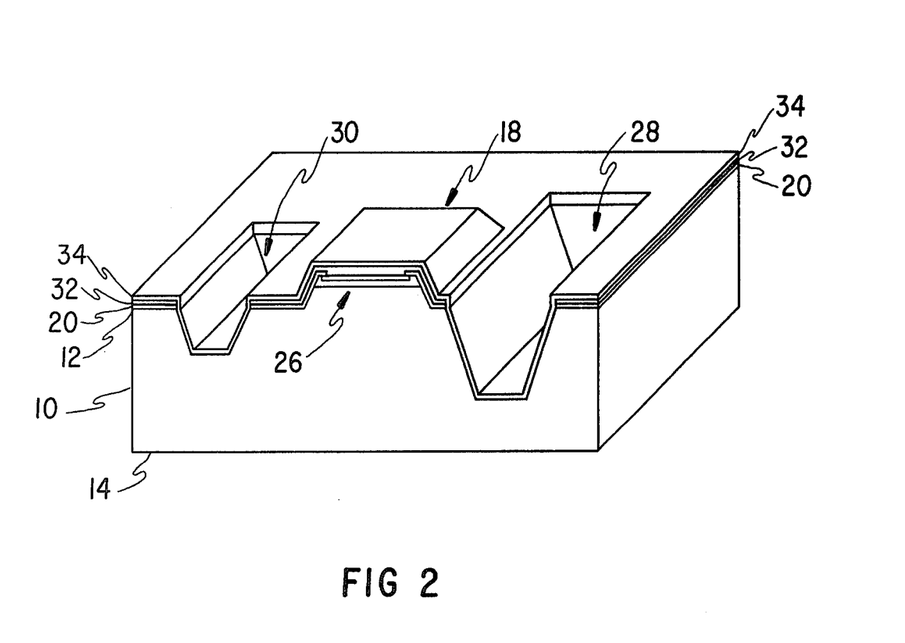
FIG. 2 is a cross-sectional projection of the semiconductor substrate of FIG. 1 with a first and a second cavity etched into the one surface of the substrate.

FIG. 2 shows the same substrate shown in FIG. 1 after a first cavity 28 and a second cavity 30 have been etched into first surface 12. Prior to etching of either cavity, first surface 12 is prepared by depositing a second protective layer 32 (typically silicon nitride) on the entire surface of first protective layer 20 and the exposed surface of diffusion layer 24. Second protective layer 32 passivates the junction region of diode 26 and forms an etch mask for the etching of first and second cavities 28 and 30, respectively.

Second protective layer 32 is then photomasked and protective layers 20 and 32 are removed to open a rectangular window juxtaposed to mesa 18 through which first cavity 28 is etched. For non-mesa structure devices this window would be juxtaposed to a diffusion or an epitaxial layer of a different conductivity type than substrate 10 on surface 12. First cavity 28 is etched by a time-temperature anisotropic technique. By using this technique the etching of substrate 10 proceeds along the crystalline axes of the semiconductor material. For a (100) crystalline orientation the resultant cavity assumes a pyramidal shape.

The etching of first cavity 28 is allowed to proceed until its depth is equal to its desired depth (typically $40\mu$) less the desired depth of second cavity 30. The depth of second cavity 30 is typically ten to fifteen microns or one-quarter to one-third of the thickness of the final device. Second protective layer 32 is then photomasked on the opposite side of mesa 18 from first cavity 28, and protective layers 20 and 32 are removed to open a second rectangular window through which the smaller second cavity 30 is etched. The anisotropic etching is then reinitiated to complete the etching of first cavity 28 and to etch second cavity 30. When the etching at the selected temperature has proceeded for the desired length of time, substrate 10 is removed from the etchant and the depth of the two cavities is measured and the etching process reinitiated if necessary. Next, a third protective layer 34 (typically $SiO_2$) is deposited by a known technique on the surface of second protective layer 32 and first and second cavities 28 and 30, respectively.

Figure 3:
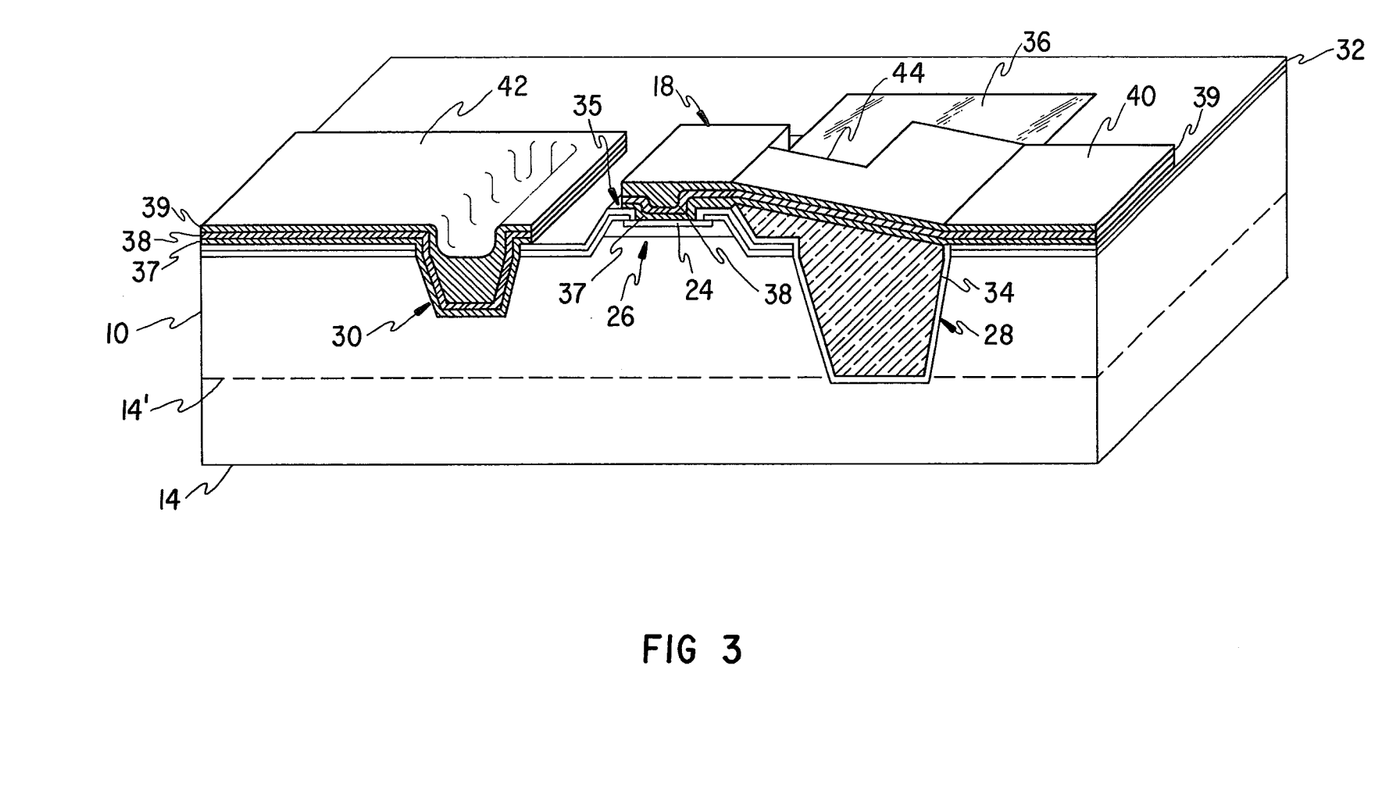
FIG. 3 is a cross-sectional projection of the semi-conductor substrate of FIG. 2 with one cavity filled with glass and the beamlead metalizations deposited to the one surface.

In FIG. 3, first cavity 28 is shown filled with a selected glass to form glass layer 36. The selected glass must be able to wet Si and $SiO_2$, have a coefficient of thermal expansion very close to that of Si, have high electrical resistivity and a high dielectric coefficient. The glass is deposited into first cavity 28 by a sedimentation technique discussed by W. A. Pliskin and E. E. Conrad in "Techniques for Obtaining Uniform Thin Glass Films on Substrates," Electrochemical Technology, July–August 1964, pp. 196–200. Any excess glass is then etched away so that the exposed surface of glass layer 36 forms a continuous nearly flat surface extending from the top edge of mesa 18 closest to cavity 28 to the top edge of cavity 28 furthest from mesa 18. For non-mesa structures the glass layer 36 must simply fill cavity 28 to the top surface. Third protective layer 34 is partially attacked by the glass etchant resulting in an uneven layer. The remainder of exposed third protective layer 34 is then etched from the surface of second protective layer 32.

Second protective layer 32 above diode 26 on mesa 18 is next masked and etched by known photolithographic and etching techniques to open a window 35 that extends to the surface of diffusion layer 24. First and second contact metalization layers 37 and 38, respectively, are then deposited through window 35 onto diffusion layer 24, into cavity 30, and over the remainder of the first surface of substrate 10 by known vacuum metalization techniques. First metalization of layer 37 is selected for low contact resistance and strong adherence, and is typically either titanium or nichrome. An oxidation-resistant cover metal, such as gold, is typically used for second metalization layer 38.

A third metalization layer 39 of a metal (typically gold) is selectively plated on the surface of second metalization layer 38 by known photomasking and electroplating techniques. This third metalization layer 39 thus defines the cutline of the tri-layer anode and cathode beam leads 40 and 42, respectively. Anode beamlead 40 thus makes electrical contact with the anode of diode 26, namely, diffusion layer 24, via metalization layers 37 and 38. Beamlead 40 then continues across the nearly flat surface of glass layer 36 and second protective layer 32. The combination of thick glass layer 36 and beamlead 40 with its narrow region 44 where it comes closest to the n+ cathode region of substrate 10 greatly reduces the parasitic capacitance (by typically a factor of 10) between beamlead 40 and the cathode of diode 26 in the finished configuration of FIGS. 5 and 6 from that of the prior art devices shown. For semiconductor devices without a mesa structure, anode beamlead 40 is fabricated and connected to the active device as in the mesa structure. Cathode beamlead 42 extends from the top edge closest to mesa 18 of, and through, second cavity 30 with only a small lip extending over the edge to the surface of second protective layer 32 adjacent to mesa 18 and continues across the surface of second protective layer 32 away from mesa 18. The plating of third metalization layer 39 is followed by a final etching step on the first surface of substrate 10 to remove that portion of first and second metalization layers 37 and 38, respectively, that is not beneath third metalization layer 39. Substrate 10 is next mounted on a carrier with the first surface embedded in a selected wax to both hold it during the processing of, and to protect the first surface from the various etchants used on, second surface 14 of substrate 10.

Figure 4:
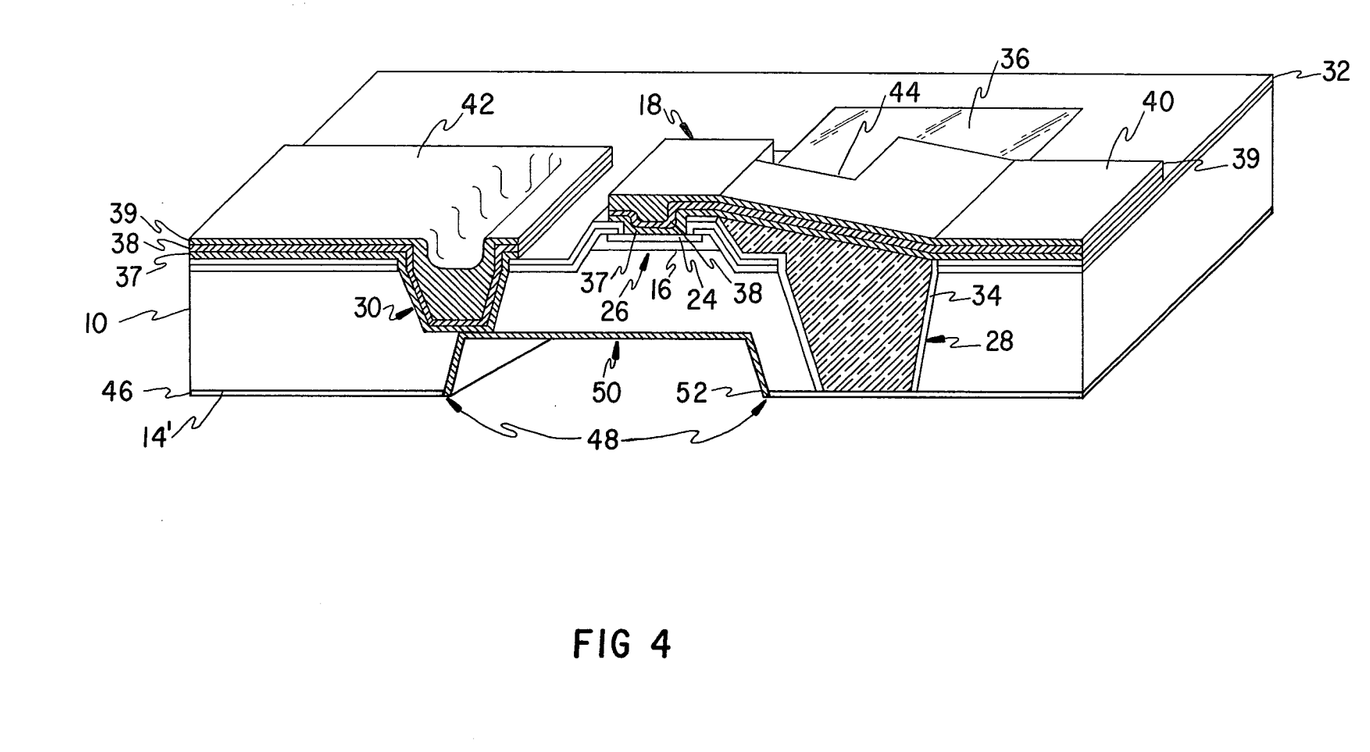
FIG. 4 is a cross-sectional projection of the semi-conductor substrate of FIG. 3 with a metalized third cavity etched into the other surface of the substrate adjacent to the mesa structure and in contact with the metalization of one of the cavities etched into the substrate from the one surface.

FIG. 4 shows substrate 10 after it has been thinned forming a new second surface 14' even with the bottom surface of glass layer 36 in first cavity 28. The thinning process can be done by any known technique such as lapping and polishing or etching. Whichever technique is used, the extent of the thinning of substrate 10 is controlled optically to detect when the bottom surface of glass layer 36 is exposed to the new second surface 14' at which time the process is halted.

Second surface 14' is then masked with a fourth protective layer 46 (typically vacuum metalization) and window 48 is opened in layer 46 adjacent to both mesa 18 and second cavity 30. A third cavity 50 is then etched by means of a time-temperature anisotropic etching technique through window 48. The etching process is let continue until the deepest extent of the metalization of cathode beamlead 42 is detected visually in the deepest extent of third cavity 50, thus forming a via between the two surfaces of substrate 10.

Figure 5:
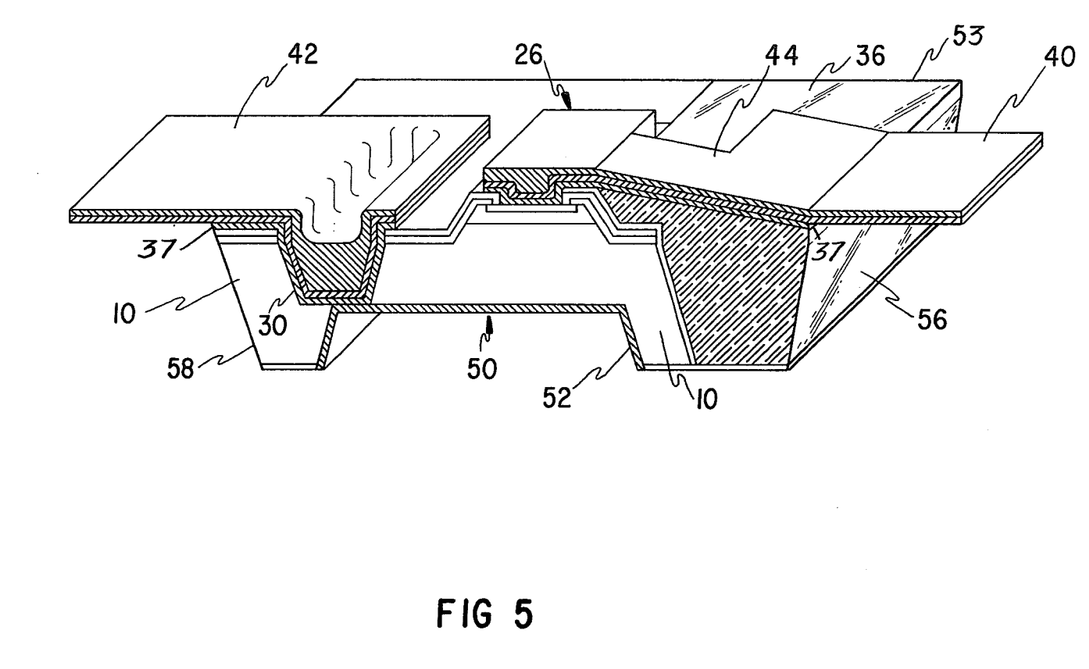
FIG. 5 is a cross-sectional projection of the semi-conductor device of the present invention with glass isolation of the anode beamlead from the semiconductor substrate and metalized via connecting the cathode beamlead on one surface of the substrate connected to the cathode on the other side of the substrate.
Figure 6:
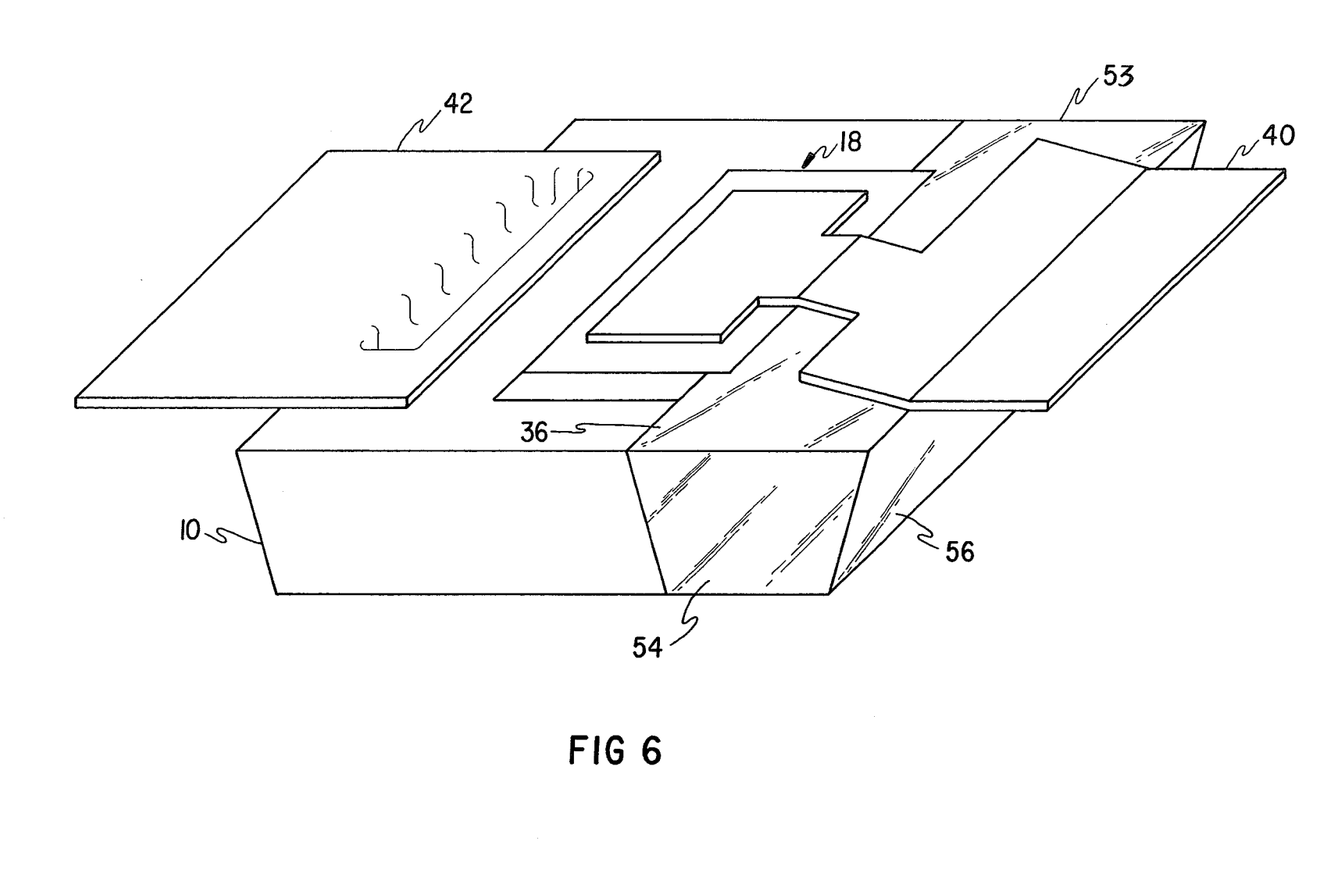
FIG. 6 is a projection of the individual semiconductor device of the present invention.

Next, the interior surface of third cavity 50 is metalized in the same manner as is the surface of diffusion layer 24. Metalization layer 52 consists of a deposited low contact resistance layer similar to layer 37, followed by a deposited oxidation-resistant layer similar to layer 38, and a plated layer similar to layer 39. In the finished device, metalization layer 52 provides heat sinking for diode 26, and a shortened diode current path between epitaxial layer 16 and cathode beamlead 42 by means of the metalized via of second cavity 30. In this configuration, the longest current path is from anode beamlead 40 to metalization layer 52 within cavity 50. This shortened diode current path effectively reduces the thickness of the active device and thus presents a lower series resistance to the device current. The final step is to open a window in fourth protective layer 46 in the field between each of the devices to allow their separation by etching. The field of substrate 10 is etched so that the outline of the final device is as shown in FIGS. 5 and 6. At the anode beamlead end of the device, the field of substrate 10 is etched away to expose the ends 54, and side 56 of glass layer 36, thus completely removing all of substrate 10 from beneath anode beamlead 40. The width of substrate 10 beneath mesa 18 and cathode beamlead 42 is masked to retain the width of glass 36 along the entire device. At the cathode beamlead end of the device, substrate 10 is etched from the field so that a region 58 of substrate 10 is formed beneath, and to provide support for cathode beamlead 42 and metalized second cavity 30, and adjacent to third cavity 50. The exposed portions of metal layer 37 are also etched from beamleads 40 and 42. The individual devices are then removed from the carrier by dissolving the wax in which they are held. Glass isolation is not necessary on the cathode end of the device since cathode beamlead 42 is connected directly to substrate 10 through the via formed between cavities 30 and 50 and within cavity 50.

The features of the above-discussed process are by no means limited to producing beamlead devices. The glass isolation feature can be utilized in any device or interconnection of devices where parasitic capacitance between leads or conductive layers is to be minimized. In some configurations, such as a diode ring quad, the glass also adds structural strength to the finished device. The shortening of the current path of the device by means of the via created by the metalized second and third cavities 30 and 50, respectively, lends itself to any device where the resistivity of the substrate is a significant factor.

We claim:
1. A low-parasitic capacitance and electrical resistance semiconductor component comprising:
   semiconductor means having a substrate with a first and a second surface, a plurality of edges, and a plurality of layers of selected conductivity types for implementing a selected semiconductor device on the first surface adjacent to one of said edges;
   a block of a selected glass juxtaposed to the full height and width of said one edge of the semiconductor means and extending over said one edge of the first surface of the semiconductor means to the semiconductor device with the exposed surface of the glass block being substantially flush with the surface thereof; and
   first conductive means extending across the exposed surface of the glass block for electrically contacting one of the layers of the semiconductor device on the first surface of the semiconductor means.

2. A semiconductor component as in claim 1 wherein said first conductive means includes a narrow region over the portion of the glass block extending between said one edge of the semiconductor means and the semiconductor device to further reduce the parasitic capacitance between the first conductive means and the layers of the semiconductor means to which it is not electrically connected.

3. A semiconductor component as in claim 1 wherein:
   said semiconductor means defines one cavity in its first surface adjacent to the semiconductor device and on another side of the semiconductor device from said glass block and another cavity in its second surface in registration with the semiconductor device and said one cavity on the first surface to thin the substrate beneath the semiconductor device to reduce the resistivity of said device, said other cavity being deep enough to open a portion of the deepest surface of the one cavity to the deepest surface of the other cavity, creating a via between the first and second surfaces of the semiconductor means; and a second conductive means deposited on the surfaces of the one and other cavities and the first surface of the substrate, extending thereacross away from the semiconductor device for providing electrical connection to the substrate on the second surface of the semiconductor means to further reduce the resistivity of the semiconductor device by shortening the current between the semiconductor device and the second conductive means.

4. A semiconductor component as in claim 3 wherein said first and second conductive means extend beyond the edge of the glass block and the substrate, respectively, to form beamleads.

5. A low electrical resistance semiconductor component comprising:

semiconductor means having a substrate with a first and a second surface and a plurality of layers of selected conductivity types for implementing a selected semiconductor device on the first surface, said semiconductor means further defining one cavity in the first surface of the substrate adjacent to the semiconductor device and another cavity in the second surface of the substrate in registration with the semiconductor device and said one cavity on the first surface of the substrate for thinning the substrate beneath the semiconductor device to reduce the resistivity of said device, said other cavity being deep enough to open a portion of the deepest surface of the one cavity thereinto, creating a via between the first and second surfaces of the semiconductor means; and conductive means deposited on the surfaces of the one and other cavities and the first surface of the substrate extending thereacross away from the semiconductor device for providing an electrical connection to the substrate on the second surface of the semiconductor means to further reduce the resistivity of the semiconductor device by shortening the current path between the semiconductor device and the conductive means.

* * * * *

UNITED STATES PATENT AND TRADEMARK OFFICE
CERTIFICATE OF CORRECTION

PATENT NO. : 4,097,890

DATED : June 27, 1978

INVENTOR(S) : Raymond A. Morris, Thomas J. Viola, Jr.

It is certified that error appears in the above-identified patent and that said Letters Patent are hereby corrected as shown below:

Column 3, line 48, delete " 12" " and insert -- 12' --;

Column 4, line 69, delete "cutline" and insert -- outline --;

Column 6, line 1, delete "54" and insert -- 53 --;

Column 7, line 10, after the word "current" insert -- path --.

Signed and Sealed this

Nineteenth Day of December 1978

[SEAL]

Attest:

RUTH C. MASON
*Attesting Officer*

DONALD W. BANNER
*Commissioner of Patents and Trademarks*